United States Patent
Chiu

(10) Patent No.: US 8,389,390 B2
(45) Date of Patent: Mar. 5, 2013

(54) METHOD OF IMPURITY INTRODUCTION AND CONTROLLED SURFACE REMOVAL

(76) Inventor: Tzu-Yin Chiu, Milpitas, CA (US)

( * ) Notice: Subject to any disclaimer, the term of this patent is extended or adjusted under 35 U.S.C. 154(b) by 145 days.

(21) Appl. No.: 12/101,115

(22) Filed: Apr. 10, 2008

(65) Prior Publication Data

US 2008/0254602 A1 Oct. 16, 2008

Related U.S. Application Data

(60) Provisional application No. 60/911,076, filed on Apr. 10, 2007.

(51) Int. Cl.
*C23C 12/00* (2006.01)
(52) U.S. Cl. ........ 438/513; 427/524; 427/526; 427/530; 427/531
(58) Field of Classification Search .......... 438/514–519, 438/527, 549, 560
See application file for complete search history.

(56) References Cited

U.S. PATENT DOCUMENTS

| | | | | |
|---|---|---|---|---|
| 4,618,381 | A | * | 10/1986 | Sato et al. ..................... 438/513 |
| 4,990,229 | A | * | 2/1991 | Campbell et al. ........ 204/298.06 |
| 5,858,471 | A | * | 1/1999 | Ray et al. ..................... 427/524 |
| 6,200,883 | B1 | * | 3/2001 | Taylor et al. .................. 438/514 |
| 7,238,597 | B2 | * | 7/2007 | Williams ...................... 438/513 |
| 2002/0187614 | A1 | * | 12/2002 | Downey ........................ 438/407 |

* cited by examiner

*Primary Examiner* — David Vu
*Assistant Examiner* — Jonathan Han
(74) *Attorney, Agent, or Firm* — Kilpatrick Townsend & Stockton LLP

(57) ABSTRACT

A method of introducing an impurity into a wafer surface is provided. The method comprises the steps of: low energy implantation of impurity into a surface of the wafer to generate an implanted dopant layer; and simultaneously removing an implanted surface of the implanted dopant layer to generate a doping profile with controlled areal impurity dosage.

19 Claims, 1 Drawing Sheet

METHOD OF IMPURITY INTRODUCTION AND CONTROLLED SURFACE REMOVAL

RELATED APPLICATIONS

This application claims priority benefit of U.S. Provisional Application Ser. No. 60/911,076, filed Apr. 10, 2007, which is herein incorporated by reference.

BACKGROUND

1. Field of Invention

The present invention relates to a method of introducing an impurity into a wafer surface. More particularly, the present invention relates to a method of introducing an impurity into a wafer surface with low energy implantation and controlled surface removal.

2. Description of Related Art

Ion implantation has been a process of choice to introduce dopant into silicon substrate in advanced CMOS technology. As device continue to be scaled, the need for ultra shallow junction formation becomes increasingly important for the source/drain area. In the production of very small devices, it is necessary to reduce the junction depths. Most of the work in shallow junction formation has concentrated on applying conventional ion implantation to form very shallow source/drain for submicron CMOS.

A great deal of emphasis has been placed on reducing the implant energy. Many manufacturers of ion implant equipment are pushing their systems to a few keV. Some options for forming ultra shallow junctions includes using a layer on top of the silicon as a diffusion source, using a plasma immersion doping as an ion source. However, modern ion implanters are often expensive and present many challenges to form ultra shallow junctions. For example, advanced low energy implanter has to add decelerators to conventional tool set up in order to achieve the proper low energy range. This addition poses challenges in technical parameters and cost. Plasma immersion doping method has the potential for shallow junction formation. However, the dopant dosage is hard to control with high precision, namely, the uniformity of the profile across the wafer is difficult to control. Therefore, a new method of high dose and low energy ion implantation is needed.

SUMMARY

The present invention provides a method of introducing an impurity into a wafer surface, the method comprises the steps of: low energy implantation of impurity into a surface of the wafer to generate an implanted dopant layer; and simultaneously removing an implanted surface of the implanted dopant layer to generate a doping profile with uniform areal impurity dosage.

In general, ion-milling machine does not contain precision voltage control to achieve energy purity or mass selection mechanism to achieve atomic species purity. However, ion-milling can be viewed as a low energy implantation mechanism with an additional surface removal by a physical sputtering mechanism.

By combining implantation and surface removal simultaneously, as will be demonstrated, the dopant profile and dosage will achieve a steady state after the removing of a surface layer with a thickness equals to approximately two times of the implant range.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
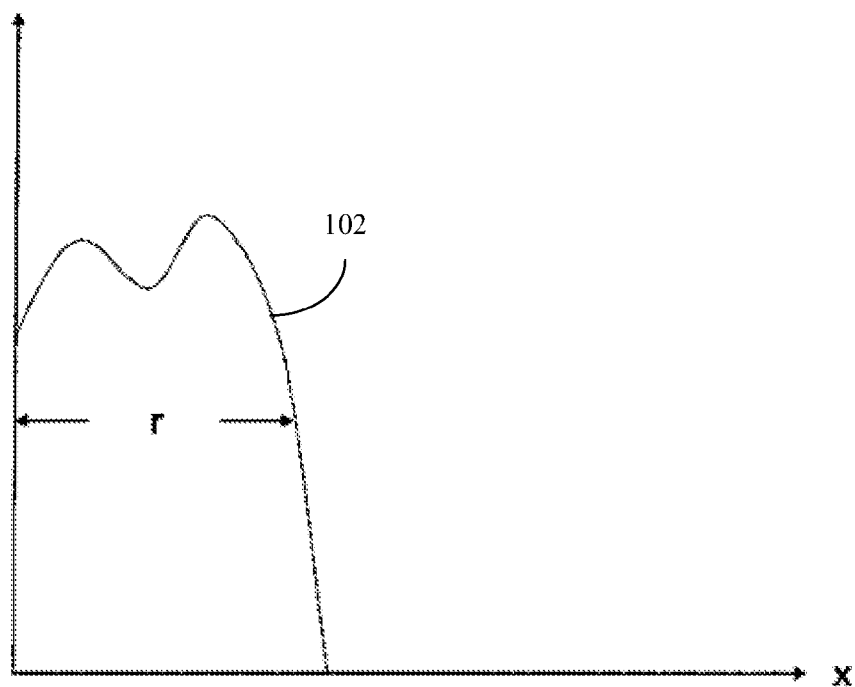
FIG. 1 is a diagram of the normalized first doping profile for the low energy implant when the amount of surface removal is yet negligible.

Reference will now be made in detail to the present preferred embodiments of the invention, examples of which are illustrated in the accompanying drawings. Wherever possible, the same reference numbers are used in the drawings and the description to refer to the same or like parts.

Ion-milling machines are used to implant low energy and high dosage ions into the wafer surface. The basic ion-milling mechanism is to ionize the input gas in an ionization chamber and accelerate the ions through an electric field to attain certain energy. The energetic beam, containing ions and neutrals, impinges on the surface causing simultaneous sputtering as well as shallow implantation. The low cost ion-milling does not carry out ion separation or atomic separation. As a result the incident beam is a mixture of ion and neutrals with an energy distribution. In the present embodiment, the incident beam may contain both dopant gas and carrier gas in the form of ion and neutrals with an energy distribution, and the dosage of dopant in the wafer surface is modulated by the partial pressure of a mixture of dopant gas and carrier gas. The carrier gas is used to modify an atomic density of the implanted layer, a sputtering yield or a surface etching rate of the removal process. By combining the implanting and sputter effect of ion-milling, a uniform flat box profile can be obtained. In other embodiment, the forming steps can be performed by a plasma generating equipment with proper implant and removal characteristics, and the removing process can also be made by reactive ion etching (RIE) process.

Please refer to FIG. 1, a normalized first doping profile, $G(x)$, for the low energy implant when the amount of surface removal is yet negligible. The horizontal axis is the linear distance from the substrate surface, and the vertical axis is the dopant concentration in log scale. $G(x)$ can be expressed as follow, $$G(x) = \int_0^{E_0} D(E) f(x, E) dE \quad \text{(Eq. 1)}$$

x is a distance from the wafer surface, E is the ion energy, $D(E)$ is the energy distribution of the incoming dopant flux (with carrier gas component, if used, excluded), $f(x, E)$ is the normalized dopant distribution profile at a monotonic energy, E, and $E_0$ is an upper limit of the energy distribution of the ion beam. The implant depth, r, can be controlled to within 10 nm when the accelerating voltage of the ion beam is less than 1 KeV.

The dopant profile, G(x), probably does not have a simple Gaussian distribution generally used to model a mono energetic implant beam. The actual profile will depend on the energy distribution of the incident flux. FIG. 1, for illustration purpose, shows double dopant peaks. The one peak further into the surface could be due to ions that gained full accelerating potential. The shallower peak could be due to neutrals that had gained energy partially through the accelerating field before neutralization occurs.

Figure 2:
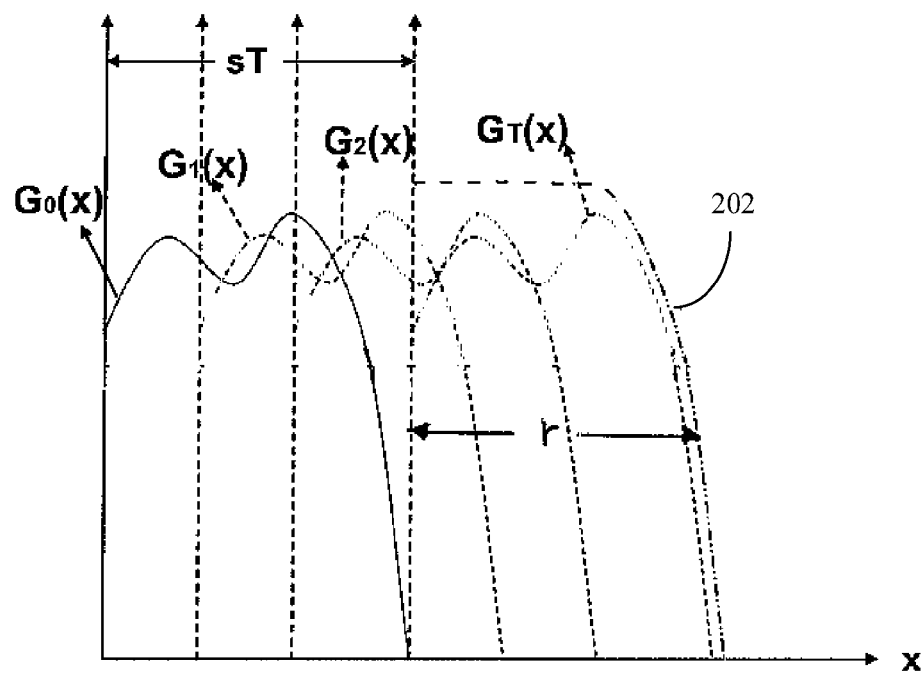
FIG. 2 is a diagram of the normalized second doping profile when the surface layer is being removed at a rate of s.

FIG. 2 shows that as the surface layer is being removed, at a rate "s", the implant profile, $G_0$, moves through space and are shown as $G_1$, $G_2$, and finally $G_T$. With "sT" amount of surface layer removed. In the case of ion-milling "sT" is the amount of surface layer sputtered. The second doping profile, i.e. the concentration profile 202 is proportional to incident flux, J, and is the result of sputtering over a period of time, T, where:

$$C(x, T) = \int_0^T JG(x - st)dt, \quad s = JY/\rho \qquad \text{(Eq. 2)}$$

where
s is the rate of surface removal
Y is the effective sputtering yield with carrier gas accounted
$\rho$ is the effective atomic density
x is the distance from the original surface
T is the time
J is the incident flux
C(x, T) is the second doping profile, i.e. the dopant concentration from the original surface at time T
$G_0(x)$, $G_1(x)$, $G_2(X)$, $G_T(x)$ are the instantaneous dopant profile at t=0, 1, 2, and T, respectively. The following coordinate transformation fixes the moving surface to zero:

$$u = x - st$$

$$du = -sdt$$

or $$dt = -du/s$$

Eq. 2 transforms to $$C(v, T) = \int_{u(t=0)}^{u(t=T)} -(J/s)G(u)du \qquad \text{(Eq. 2A)}$$

$$= \int_{u(t=T)}^{u(t=0)} (J/s)G(u)du$$

$$u(t = T) = x - sT = v$$

$$u(t = 0) = x = v + sT$$

The variable, v, is the distance from the etched surface at time, T. Eq. 2A becomes;

$$C(v, T) = J/s \int_v^{v+sT} G(u)du \qquad \text{(Eq. 2B)}$$

-continued $$= J/s \left[ \int_0^{v+sT} G(u)du - \int_0^v G(u)du \right]$$

In case the amount removed, sT, is very large or even just larger than the implant depth, $$\int_0^{v+sT} G(u)du \cong 1.$$

Eq. 2B becomes $$C(v) = J/s \left[ 1 - \int_0^v G(u)du \right] \qquad \text{(Eq. 3)}$$

$$= \rho/Y \left[ 1 - \int_0^v G(u)du \right]$$

Eq. 3 reveals that the dosage is independent of the time T, the flux density J, or the removal rate s. In short, due to the convolution of the instantaneous profiles over time T, after the removal of sT amount of material (sT is greater than or equal to r, the implant depth) from the wafer surface, the second doping profile 202 becomes a relatively flat profile down to r, typically a range of less than 20 nm. Therefore, after sputtering through roughly a distance, r, the profile approaches steady state and approximates a classic box profile. As illustrated qualitatively by FIG. 2, if the implant depth is about 5 nm to 20 nm, then by removing 5 nm to 20 nm off the wafer surface, a flat box profile of 5 nm to 20 nm can be formed in the wafer substrate. This profile will be maintained even if the etch/implant process were to continue further. Due to simultaneous implant and surface removal, the final profile approaches a steady state as a function of depth into silicon and is uniform across the wafer after the surface layer removed is greater than "r". The qualitative explanation above can be concisely formulated by the following mathematical equations.

In addition, an important feature in shallow junction implantation is the ability to control dose concentration. The total dose, D, remaining in the Si in the steady state can be calculated as follows:

$$D = \int_0^\infty C(v, T = \infty)dv \qquad \text{(Eq. 4)}$$

$$= J/s \int_0^\infty \left( \left( \int_v^\infty G(u)du \right) \right) dv$$

$$= \rho/Y \int_0^\infty vG(v)dv$$

Where the projected implant range, $$Rp = \int_0^\infty vG(v)dv.$$

Therefore, the total implant incorporated dosage is;

$$D = \frac{\rho}{Y} Rp \qquad \text{(Eq. 5)}$$

Eq. 5 indicates that the dosage of the ions is independent of flux density and is only a function of density, sputtering yield and projected range, ρ, Y and Rp respectively.

In conclusion, the embodiment of the present invention is a method of implanting a dose of ions into a wafer surface by the use of an ion-milling machine or other energetic sources. The ion-milling machine introduces an ultra shallow ion implantation in the wafer substrate while sputtering the wafer surface to achieve uniform doping profile. Other controlled surface removal method, such as RIE can also apply. By using ion-milling machines as low energy high dose implanters, cost of equipment can be significantly reduced while dose uniformity can be obtained independent of purity in the ion beam.

It will be apparent to those skilled in the art that various modifications and variations can be made to the source of the energetic particle and the surface removal method of the present invention without departing from the scope or spirit of the invention. In view of the foregoing, it is intended that the present invention cover modifications and variations of this invention provided they fall within the scope of the following claims and their equivalents.

What is claimed is:

1. A method of introducing dopants into a semiconductor wafer, the method comprising:
   implanting the dopants into a region positioned below a surface of the semiconductor wafer using an ion beam to form a first implanted layer, said dopants when activated causing a conductivity of the implanted layer to be either of N-type or P-type;
   concurrently removing a layer from the semiconductor wafer surface using the ion beam, said layer comprising a portion of said dopants; and
   continuing the implanting of the dopants and removal of the wafer surface layer until a concentration of dopants positioned within a depth from a final surface of the wafer is substantially uniform.

2. The method of claim 1, wherein the implanting is performed by an ion-milling machine.

3. The method of claim 1, wherein the implanting is performed by a plasma generating equipment with proper implant and removal characteristics.

4. The method of claim 1, wherein the surface layer is removed using a process consisting of sputtering, ion milling or reactive ion etching (RIE).

5. The method in claim 1, wherein the dosage of the dopants implanted incorporated in the wafer surface is independent of an incident flux of the dopants and its total integrated dosage.

6. The method in claim 5, wherein the concentration of the dopant near the wafer surface is modulated by a partial pressure of a mixture of dopant gas and carrier gas.

7. The method in claim 6, wherein the carrier gas is used to modify the density of the implanted dopant layer, the sputtering yield or the etching rate of the surface removal.

8. The method of claim 1, wherein a doping profile G(x) associated with an initial implanted dopant layer is defined by:

$$G(x) = \int_0^{E_0} D(E) f(x,E) dE;$$

wherein x is a distance from the wafer surface, E is the ion energy, D(E) is the energy distribution of the ion bean, f(x, E) is the normalized dopant distribution profile at a monotonic energy, E, and $E_0$ is an upper limit of the energy distribution of the ion beam.

9. The method of claim 8, wherein a doping profile with respect to a new surface front C(x,T) is defined by:

$$C(x,T) = \int_0^T JG(x-st) dt;$$

wherein s is the rate of removing the wafer surface, J is the incident ion beam flux, x is the distance from the original surface, t is a removing time and T is the period of time to remove the wafer surface.

10. The method of claim 1, wherein the wafer surface is removed by between 5–20 nm.

11. The method of claim 1, wherein a final doping profile has a range of less than 20 nm.

12. The method of claim 1 wherein the ion beam accelerates and impinges on the surface causing the simultaneous removing the surface and generating the dopant profile.

13. The method of claim 1 wherein the ion beam comprises ions and neutrals.

14. The method of claim 1 further comprising terminating the implanting and removing steps when a new surface of the wafer reaches a peak of impurity concentration in the first implanted layer.

15. The method of claim 1 further comprising, after a new surface of the wafer reaches a peak of impurity concentration in the first implanted layer, continuing the implanting and removing steps, while maintaining a substantially same impurity concentration in the remaining wafer despite receding surface front.

16. A method of introducing dopants into a semiconductor wafer, the method comprising:
   implanting the dopants into a region positioned below a surface of the semiconductor wafer using an ion beam to form a first implanted layer;
   concurrently removing a layer from the semiconductor wafer surface using the ion beam, said layer comprising a portion of said dopants; and
   continuing the implanting of the dopants and removal of the wafer surface layer, each implanting of the dopants and removal of the wafer surface layer resulting in a new surface of the wafer that is recessed from a previous wafer surface.

17. The method of claim 16 further comprising terminating the implanting and removal when the surface of the wafer reaches a peak of impurity concentration in the first implanted layer and a concentration of dopants positioned within a depth from a final surface of the wafer is substantially uniform.

18. The method of claim 16 further comprising, after the wafer surface reaches a peak of impurity concentration in the first implanted layer, continuing the implanting and removal, whereby the wafer surface is continuously being recessed while maintaining a substantially same dopant concentration positioned within a depth from a surface of the remaining wafer.

19. The method of claim 16 wherein the continuous implanting of the dopants and removal of the wafer surface layer is carried out using identical implantation dosage and energy.

* * * * *